No. 12,656. REISSUED MAY 28, 1907.

J. A. COCKER.

CRIMPING MECHANISM FOR WIRE FENCE MACHINES.

APPLICATION FILED MAR. 13, 1907.

3 SHEETS—SHEET 1.

WITNESSES

R. A. Balderson

W. W. Swartz

INVENTOR

J. A. Cocker by Baldwin & Dyer his atty's

No. 12,656. REISSUED MAY 28, 1907.

J. A. COCKER.

CRIMPING MECHANISM FOR WIRE FENCE MACHINES.

APPLICATION FILED MAR. 13, 1907.

3 SHEETS—SHEET 2.

WITNESSES

R. A. Balderson

W. W. Swartz

INVENTOR

J. A. Cocker by Bakewell & Byrnes his attys

No. 12,656. REISSUED MAY 28, 1907.

J. A. COCKER.

CRIMPING MECHANISM FOR WIRE FENCE MACHINES.

APPLICATION FILED MAR. 13, 1907.

3 SHEETS—SHEET 3

WITNESSES

R. A. Balderson

W. W. Swartz

INVENTOR

J. A. Cocker by Robertson & Dyer his attys

UNITED STATES PATENT OFFICE.

JOHN A. COCKER, OF JOLIET, ILLINOIS, ASSIGNOR TO AMERICAN STEEL & WIRE COMPANY, OF CHICAGO, ILLINOIS, A CORPORATION OF NEW JERSEY.

CRIMPING MECHANISM FOR WIRE-FENCE MACHINES.

No. 12,656. Specification of Reissued Letters Patent. Reissued May 28, 1907.

Original No. 837,797, dated December 4, 1906. Application for reissue filed March 13, 1907. Serial No. 362,244.

*To all whom it may concern:*

Be it known that I, JOHN A. COCKER, of Joliet, Will county, Illinois, have invented a new and useful Improvement in Crimping Mechanism for Wire-Fence Machines, of which the following is a full, clear, and exact description, reference being had to the accompanying drawings, forming part of this specification, in which—

Figure 1:
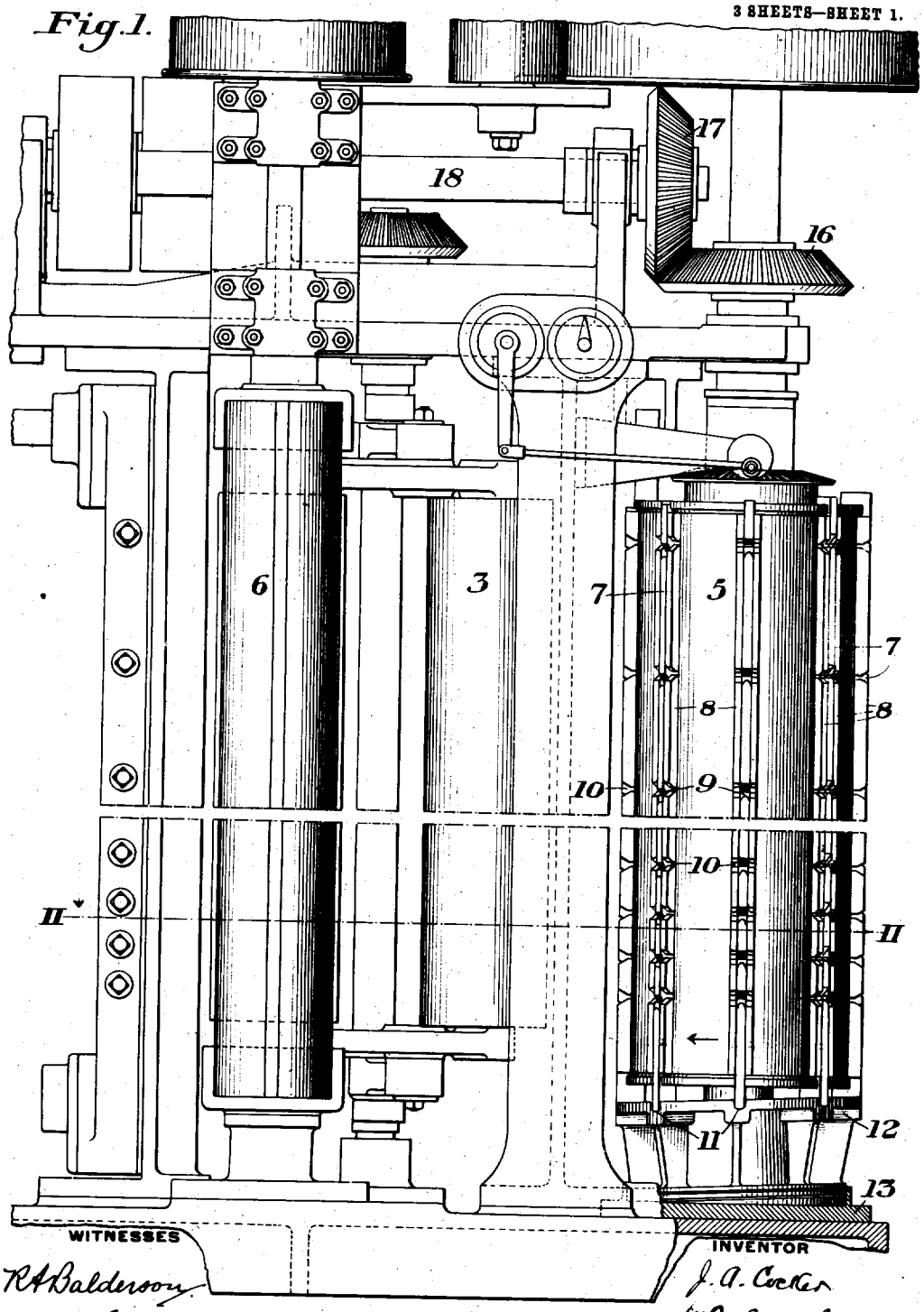
Figure 2:
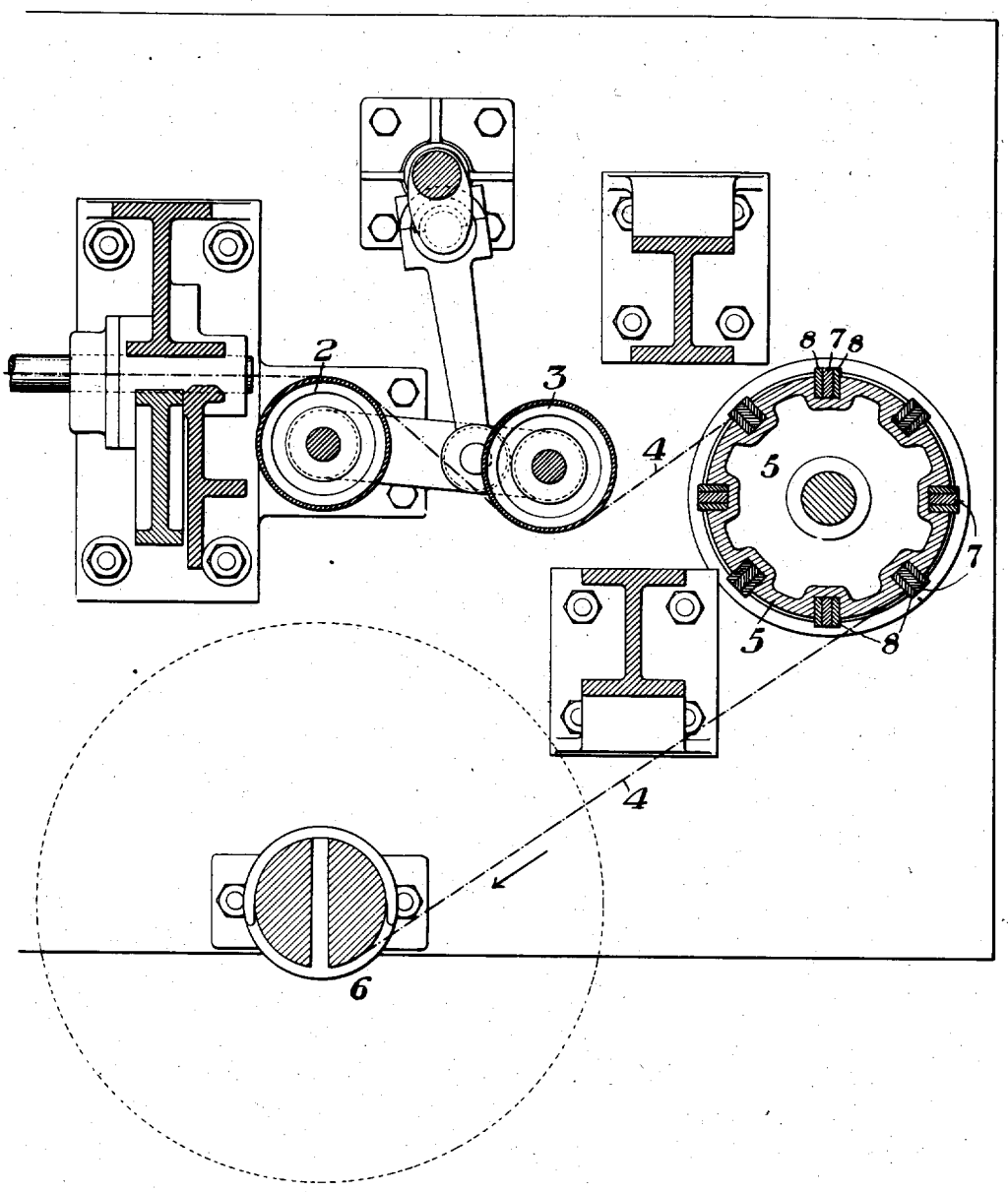
Figure 3:
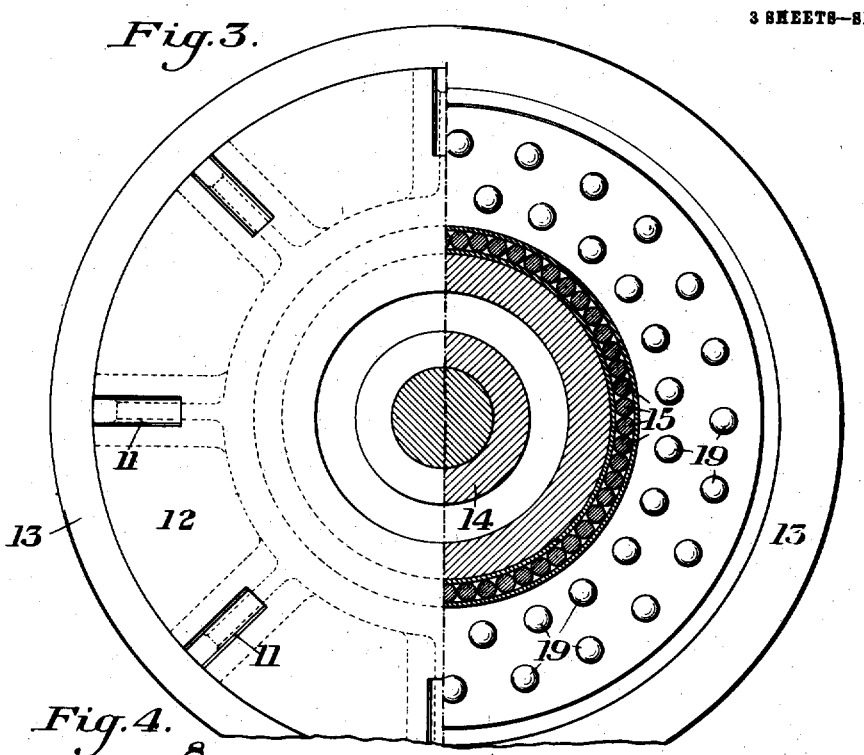
Figure 4:
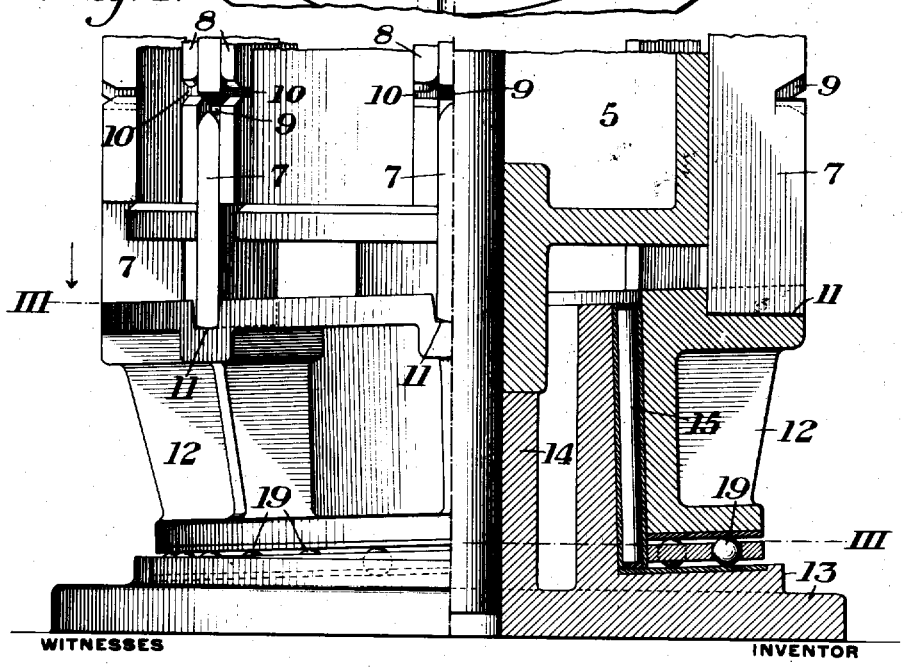

Figure 1 is a side elevation of that portion of a wire-fence machine which embodies my improvement. Fig. 2 is a section on the line II—II of Fig. 1. Fig. 3 is a section on the irregular line III—III of Fig. 4; and Fig. 4 is a view, partly broken away, showing the lower portion of the crimping roll or drum and the actuating mechanism for the crimping-bars, one-half of the view being in side elevation and the other half in vertical section.

My invention has relation to means for forming crimps or corrugations in the longitudinal wires of wire-fencing or woven-wire fabric, and is designed to provide means of novel and effective character for actuating the crimping members or bars, which will operate with less friction and with less wear and tear than the means which have commonly been employed heretofore.

My invention is applicable to various forms of woven-wire machines, being independent of the particular means which are employed for forming the fabric.

In the accompanying drawings the numerals 2 and 3 designate the guide-rolls of a wire-fence machine of any suitable character in which the fabric (indicated by the dotted line 4) is formed.

5 designates a combined pull-out and crimping drum over which the formed fabric 4 passes on its way to the winding spool or drum 6. The drum 5 is provided with a plurality of longitudinally-movable crimping-bars 7, which are seated between fixed bars 8, secured in the peripheral portion of the drum and projecting therefrom. The bars 7 are formed with a series of notches 9 to receive the longitudinal wires or strands of the fabric 4, and the fixed bars 8 are formed with corresponding notches 10. The bars 7 project at one end beyond the end of the drum 5 and are engaged in recesses 11 of a rotary member or ring 12, which is arranged to revolve upon a fixed base 13. The base 13 is preferably provided with a hub portion 14, around which the ring 12 is mounted with a series of interposed antifriction-rollers 15. The upper face of the base 13 around the hub portion 14 is an inclined plane, while the axis of the drum 5 is perpendicular to the base-line of the machine. The drum 5 is revolved in any suitable manner, as by the gearing 16 and 17, from a driven shaft 18, and by reason of the engagement with the ring 12 of the movable crimping-bar 7 said ring is rotated with the drum, its plane of rotation being inclined as described. The series of antifriction-rollers 15 have a similar inclination, as shown in Fig. 4. By reason of this inclination the upper surface of the ring is about one-half inch closer to the drum at one side than it is at the opposite side, and as the ring is revolved the movable crimping-bars 7 are during one-half of a revolution gradually raised or lifted, thereby gripping and crimping the strand-wires of the fabric 4 and also stretching the wire between the different sets of bars. During the other half-revolution the crimping-bars move downwardly by gravity or by other suitable positive means (not shown), and successively release the wires.

The ends of the bars 7 which engage the recesses 11 are provided with sufficient play or clearance therein to permit them to move as the drum rotates to maintain the perpendicular position of the bars.

I preferably mount the ring 12 upon ball-bearings 19.

The advantages of my invention consist in the simplicity of the construction and arrangement and in the fact that its operation takes place with very little friction or wear and tear of the parts.

Various changes may be made in the details of construction and arrangement by those skilled in the art without departing from the spirit and scope of my invention, since

What I claim is—

1. In a wire-crimping device, a rotatable drum, a longitudinally-movable crimping-bar mounted therein, and a rotary member engaging the bar and rotating in a plane which is inclined to the axis of the drum; substantially as described.

2. A wire gripping and crimping device, comprising a rotary drum, a plurality of endwise-movable crimping-bars carried thereby, and a rotary member journaled to rotate in a plane inclined to the axis of the drum and engaging the crimping-bars; substantially as described.

3. In a wire gripping and crimping device, a rotary drum having fixed in its periphery a plurality of notched bars arranged in pairs, a series of longitudinally-movable bars having corresponding notches and arranged one between each pair of the fixed bars, and an actuating device for the movable bars consisting of a rotary member in which the lower ends of the bars are seated, and which is journaled to rotate in a plane inclined to the axis of the drum; substantially as described.

4. In a wire gripping and crimping device, the combination with a drum having a plurality of endwise-movable crimping-bars, of a rotary member journaled to rotate in a plane inclined to the axis of the drum and engaging the said bars; substantially as described.

5. In a wire gripping and crimping device, the combination with a drum having a plurality of endwise-movable gripping and crimping bars, of a fixed base having an upper surface inclined to the axis of the drum, and a ring journaled upon said base to rotate in a plane parallel with such surface, said ring having recesses which engage the end portions of said bars; substantially as described.

In testimony whereof I have hereunto set my hand this first day of March, 1907.

JOHN A. COCKER.

Witnesses:

ERNEST H. HARPER,
FRED T. JENKINS.